(12) United States Patent
Yamashita

(10) Patent No.: US 9,991,668 B2
(45) Date of Patent: Jun. 5, 2018

(54) LIGHT EMITTING DEVICE

(71) Applicant: NICHIA CORPORATION, Anan-shi, Tokushima (JP)

(72) Inventor: Toshiaki Yamashita, Komatsushima (JP)

(73) Assignee: NICHIA CORPORATION, Anan-Shi (JP)

(*) Notice: Subject to any disclaimer, the term of this patent is extended or adjusted under 35 U.S.C. 154(b) by 0 days. days.

(21) Appl. No.: 14/883,552

(22) Filed: Oct. 14, 2015

(65) Prior Publication Data

US 2016/0109072 A1    Apr. 21, 2016

(30) Foreign Application Priority Data

Oct. 15, 2014 (JP) ................................. 2014-210474

(51) Int. Cl.
| | |
|---|---|
| *H01S 5/00* | (2006.01) |
| *H01S 5/022* | (2006.01) |
| *H01L 33/50* | (2010.01) |
| *F21V 9/16* | (2006.01) |
| *F21Y 115/10* | (2016.01) |

(52) U.S. Cl.
CPC .......... *H01S 5/005* (2013.01); *H01S 5/02296* (2013.01); *F21Y 2115/10* (2016.08); *H01L 33/507* (2013.01); *H01L 33/508* (2013.01); *H01S 5/02212* (2013.01)

(58) Field of Classification Search
CPC ......... F21K 9/64; G02B 6/0003; H01S 5/005; H01S 5/02296
USPC .......................................................... 362/84
See application file for complete search history.

(56) References Cited

U.S. PATENT DOCUMENTS

| | | | |
|---|---|---|---|
| 9,541,241 B2* | 1/2017 | Pickard | F21K 9/23 |
| 9,599,293 B2* | 3/2017 | Hikmet | H01L 33/504 |
| 9,664,351 B2* | 5/2017 | Bauer | B60Q 11/00 |
| 9,677,743 B2* | 6/2017 | Kroell | G01N 21/8806 |
| 2008/0089089 A1* | 4/2008 | Hama | A61B 1/0653 362/574 |
| 2010/0096965 A1* | 4/2010 | Oyaizu | F21V 9/16 313/1 |
| 2010/0259917 A1* | 10/2010 | Ramer | F21K 9/00 362/84 |

(Continued)

FOREIGN PATENT DOCUMENTS

| | | |
|---|---|---|
| JP | 2004-071357 A | 3/2004 |
| JP | 2006-179684 A | 7/2006 |

(Continued)

*Primary Examiner* — William N Harris
(74) *Attorney, Agent, or Firm* — Foley & Lardner LLP

(57) ABSTRACT

A laser diode device includes a semiconductor laser element, a transmissive member, and phosphor-containing members. The transmissive member is disposed separately from the semiconductor laser element and includes a plurality of recessed portions on a side opposite to a side in which light from the semiconductor laser element enters and within a region that is irradiated with the light from the semiconductor laser element. The phosphor-containing members are disposed in the plurality of recessed portions. A portion of light enters and passes through the transmissive member between the phosphor-containing members and exits the transmissive member without passing through the phosphor-containing members.

22 Claims, 14 Drawing Sheets

(56) References Cited

U.S. PATENT DOCUMENTS

| | | | |
|---|---|---|---|
| 2011/0222149 A1* | 9/2011 | Saito | F21K 9/00 |
| | | | 359/443 |
| 2011/0286200 A1* | 11/2011 | Iimura | F21V 7/041 |
| | | | 362/84 |
| 2013/0249388 A1 | 9/2013 | Ryowa et al. | |
| 2016/0360591 A1* | 12/2016 | Harbers | F21V 9/16 |

FOREIGN PATENT DOCUMENTS

| | | |
|---|---|---|
| JP | 2013-026485 A | 2/2013 |
| JP | 2013-197530 A | 9/2013 |
| JP | 2014-138081 A | 7/2014 |
| JP | 2015-011796 A | 1/2015 |

\* cited by examiner

LIGHT EMITTING DEVICE

CROSS-REFERENCE TO RELATED PATENT APPLICATION

The present application claims priority to Japanese Patent Application No. 2014-210474, filed on Oct. 15, 2014, the content of which is incorporated herein by reference in its entirety.

TECHNICAL FIELD

The present disclosure relates to a light-emitting device.

BACKGROUND

A light-emitting device which enables light of a desired wavelength to be extracted by combining light emitted from a light-emitting element with light emitted from a phosphor is known (see, for example, Japanese Patent Application Laid-open No. 2004-71357).

However, according to light-emitting devices of this type, when heat generated at the phosphor increases, heat discharge may not keep up with the heat generated and light emission efficiency of the phosphor may decline. In addition, because all light emitted from the light-emitting element passes through a wavelength-converting unit, which contains the phosphor, light extraction efficiency to the outside of the light-emitting device may decline due to absorption and scattering by the phosphor.

SUMMARY

A laser diode device includes a semiconductor laser element, a transmissive member, and phosphor-containing members. The transmissive member is provided separately from the semiconductor laser element and includes a plurality of recessed portions on a side opposite to a side on which light from the semiconductor laser element enters and within a region that is irradiated with the light from the semiconductor laser element. The phosphor-containing members are provided in the plurality of recessed portions, wherein a portion of the light from the semiconductor laser element enters and passes through the transmissive member between the phosphor-containing members and exits the transmissive member without passing through the phosphor-containing members.

According to the laser diode device described above, because heat generated at the phosphor can be radiated both from below and from the side of the phosphor-containing members, a decline in light emission efficiency of the phosphor can be prevented. In addition, because a part of light enters and passes through the transmissive member between the phosphor-containing members and exits the transmissive member without passing through the phosphor-containing members, loss of light due to the phosphor can be suppressed and a decline in light emission efficiency of the laser diode device as a whole can be prevented.

DETAILED DESCRIPTION

Light-emitting Device According to the First Embodiment

Figure 1A:
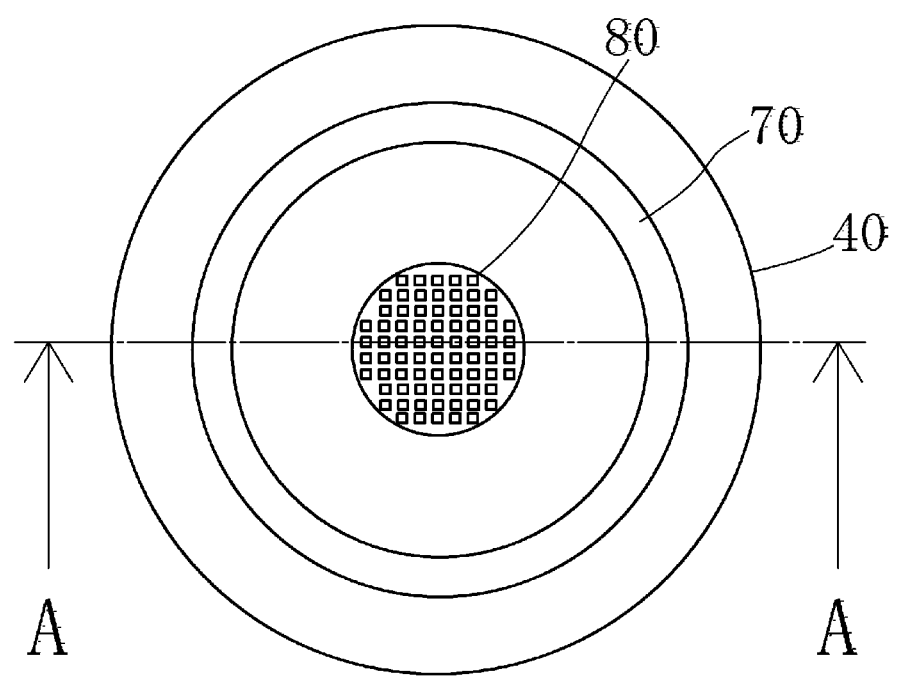
FIG. 1A is a schematic plan view of a light-emitting device according to a first embodiment.
Figure 1B:
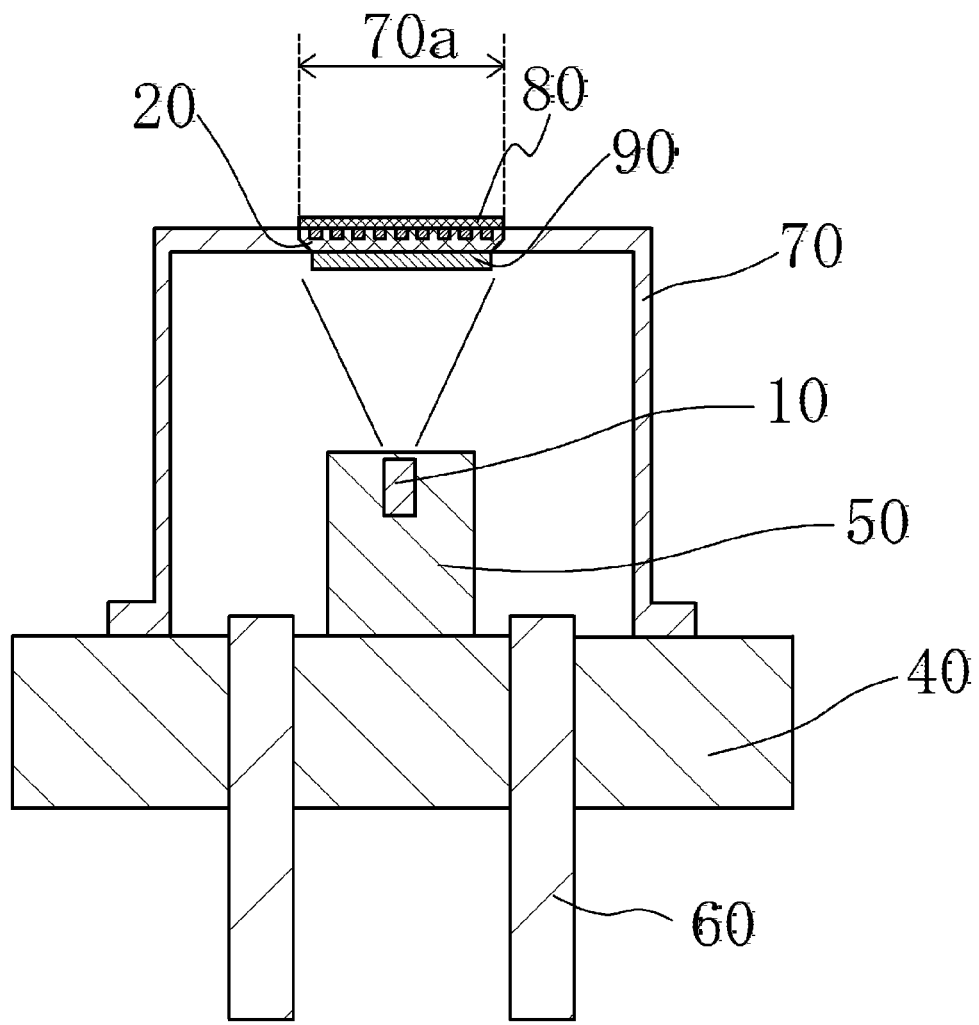
FIG. 1B is a schematic sectional view of the light-emitting device according to the first embodiment.
Figure 1C:
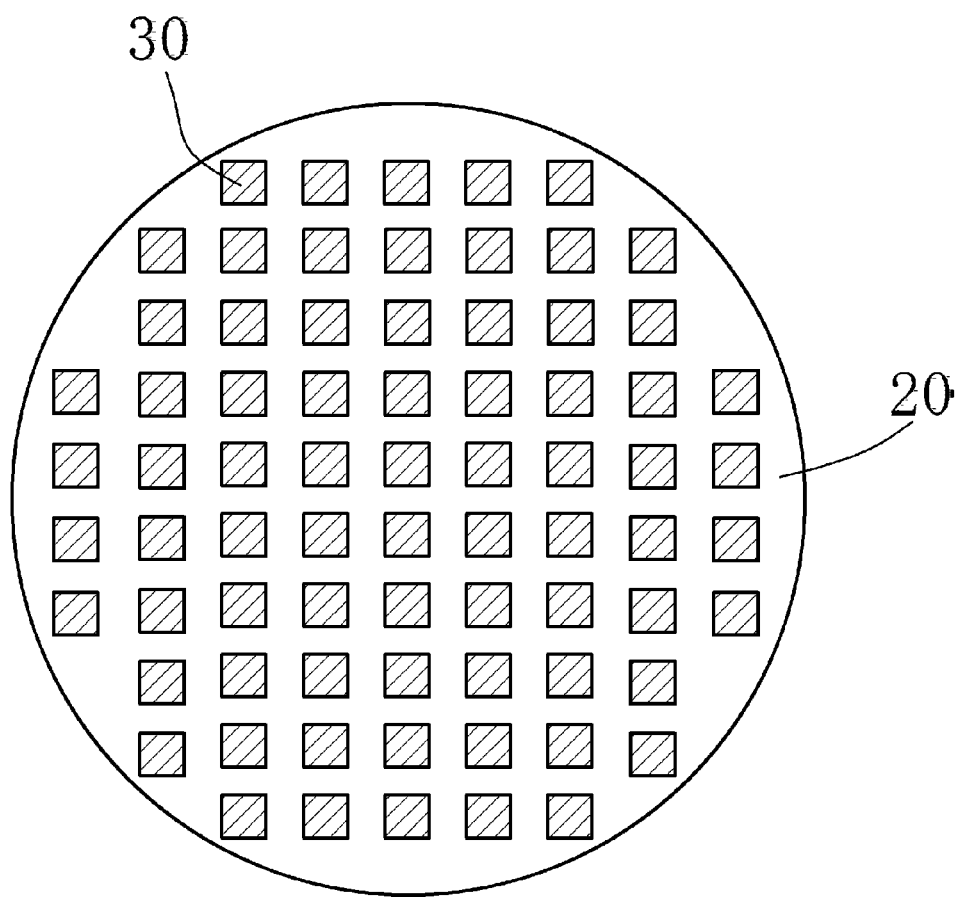
FIG. 1C is a schematic enlarged plan view showing a transmissive member and phosphor-containing members according to a first configuration.
Figure 1D:
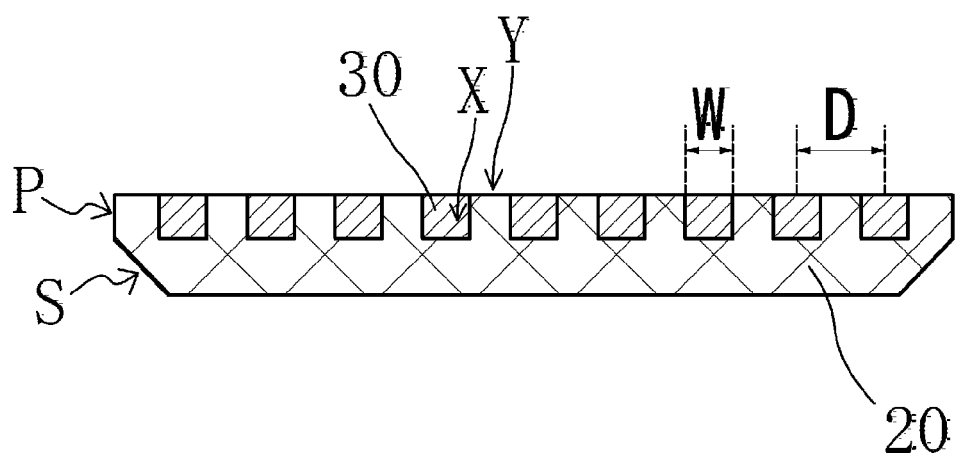
FIG. 1D is a schematic enlarged sectional view showing the transmissive member and the phosphor-containing members according to the first configuration.

FIG. 1A is a schematic plan view of a light-emitting device according to a first embodiment, and FIG. 1B is a schematic sectional view (a sectional view taken along the line A-A in FIG. 1A) of the light-emitting device according to the first embodiment. In addition, FIG. 1C is a schematic enlarged plan view showing a transmissive member and phosphor-containing members according to a first configuration, and FIG. 1D is a schematic enlarged sectional view showing the transmissive member and the phosphor-containing members of the first configuration. As shown in FIGS. 1A to 1D, the light-emitting device according to the first embodiment includes a light-emitting element 10, a transmissive member 20, and phosphor-containing members 30. The transmissive member 20 is provided separately from the light-emitting element 10 and includes a plurality of recessed portions X on a side opposite to a side on which light from the light-emitting element 10 enters and within a region that is irradiated with light from the light-emitting element 10. The phosphor-containing members 30 are provided in the plurality of recessed portions X, wherein a part of light having entered the transmissive member 20 can pass between the phosphor-containing members 30 and exit the transmissive member 20 without passing through the phosphor-containing members 30. According to the first embodiment, the phosphor is excited by light emitted from the light-emitting element 10 and emits light. As a result, a mixed light (for example, a white light) of the light from the light-emitting element 10 and the light from the phosphor is obtained. A detailed description will be given below.

Light-emitting Element 10

As a light-emitting element 10, a semiconductor laser element, a light-emitting diode element, or the like, may be used. A semiconductor laser element, a light-emitting diode element, or the like, in which a nitride semiconductor is used may be used as the semiconductor laser element, the light-emitting diode element or the like. Generally, laser light has a high light density and is likely to cause the phosphor to reach high temperatures. Therefore, a decline in light emission efficiency of the phosphor may be particularly effectively prevented according to certain embodiments of the present invention when using a semiconductor laser element as the light-emitting element 10. The light-emitting element 10 may be provided singularly or in plurality.

Transmissive Member 20

The transmissive member 20 is provided separately from the light-emitting element 10. More specifically, the transmissive member 20 is provided in a window portion 70a included in a cap 70. By providing the transmissive member 20 so as to be separated from the light-emitting element 10, propagation of heat generated at the light-emitting element 10 to the phosphor-containing members 30 is suppressed and, at the same time, propagation of heat generated at the phosphor-containing member 30 to the light-emitting element 10 is suppressed. In the present embodiment, the transmissive member 20 is arranged above the light-emitting element 10 and a plurality of recessed portions X are formed on an upper surface of the transmissive member 20.

The transmissive member 20 includes the plurality of recessed portions X. The plurality of recessed portions X are provided on a side opposite to a side in which light from the light-emitting element 10 enters. Accordingly, heat generated at the phosphor-containing members 30 can be radiated efficiently. In the phosphor-containing members 30, light density is highest at a portion in which light from the light-emitting element 10 enters (in other words, at a region on a side on which light enters). Accordingly, heat generation at the phosphor contained in the phosphor-containing member 30 tends to be higher in regions that are closer to the side on which light of the light-emitting element 10 enters. Therefore, since the configuration described above allows the transmissive member 20 to contact a portion where heat generation is largest in the phosphor-containing member 30 (in other words, at a region on a side on which light enters), heat generated at the phosphor-containing members 30 can be radiated efficiently. In addition, in a case where the phosphor-containing members 30 are provided in the plurality of recessed portions X that are provided on a side on which light from the light-emitting element 10 enters, the phosphor-containing members 30 become closer to the light-emitting element 10. Therefore, heat is likely to accumulate between the light-emitting element 10 and the transmissive member 20, and heat generated at the phosphor-containing members 30 is less likely to be efficiently radiated. However, by providing the plurality of recessed portions X on a side opposite to the side in which light from the light-emitting element 10 enters, the phosphor-containing members 30 become more separated from the light-emitting element 10. Therefore, heat is less likely to accumulate between the light-emitting element 10 and the transmissive member 20. Accordingly, heat generated at the phosphor-containing members 30 can be radiated in an efficient manner.

The recessed portions X are provided in plurality within a region which is irradiated with light from the light-emitting element 10. An amount of heat generated by the phosphor is particularly large in the region which is irradiated with light from the light-emitting element 10. Therefore, in a case where a plurality of the recessed portions X are provided within this region, by sufficiently enlarging a contact area between the phosphor-containing members 30 and the transmissive member 20, heat can be radiated in an efficient manner. A width W of the recessed portions X can be set to, for example, around 10 to 100 µm. A pitch of the recessed portions X (a distance D between centers of the recessed portions X) can be set to, for example, around twice the width of the recessed portions X. A depth of the recessed portions X can be set to, for example, around 10 to 100 µm. When particles with a large particle diameter of 10 µm or more are used as phosphor particles, the depth of the recessed portions X can be set to, for example, 50 µm or more. Meanwhile, if the depth of the recessed portions X is too deep, the transmissive member 20 may crack. Therefore, the depth of the recessed portions X is preferably shallower than half of the thickness of the transmissive member 20.

The plurality of recessed portions X are preferably regularly arranged in a plan view so that intervals between the recessed portions X are equal with each other (including cases where the intervals between the recessed portions X are approximately equal). This allows that the phosphor-containing members 30 are distributed at approximately equal intervals with respect to each other and light from the light-emitting element 10 passes between the phosphor-containing members 30. Therefore, light from the light-emitting element 10 can be efficiently extracted and color variation can be readily reduced. In the present embodiment, the plurality of recessed portions X are arranged in a dotted pattern, but this is an example of the arrangement described above. By arranging the plurality of recessed portions X in a dotted pattern, the contact area between the transmissive member 20 and the phosphor-containing members 30 can be readily increased and heat radiation can be improved.

The recessed portions X can be formed by, for example, a method using a drill or wet etching. By forming a surface of the recessed portions X into a rough surface using a drill or the like, total reflection at an interface between the transmissive member 20 and the phosphor-containing members 30 can be suppressed.

The transmissive member 20 preferably includes an inclined surface S with an inverted tapered shape (a shape inclined such that a lower surface of the transmissive member 20 is smaller than an upper surface thereof) on a portion of the side surface that is in the vicinity of a lower surface in which light from the light-emitting element 10 enters. This allows for light (returning light) that is directed from the phosphor-containing members 30 toward the light-emitting element 10 to be reflected in a direction toward the upper surface of the transmissive member 20 at the inclined surface S, and thus light can be extracted more efficiently from the light-emitting device. Alternatively, an entire side surface of the transmissive member 20 can be constituted by the inclined surface S. However, when the recessed portions X are to be formed up to a vicinity of an outer edge of the transmissive member 20, it is preferable that a portion on an upper surface-side of the side surface is constituted by a perpendicular surface P that is approximately perpendicular with respect to the upper surface, and only a portion on a lower surface-side of the side surface is constituted by the inclined surface S, for example. When using a semiconductor laser element as the light-emitting element 10, it is particularly preferable to set an angle of the inclined surface S so that an angle formed between a line parallel to an optical axis of laser light and the inclined surface S is larger than a divergence angle (half angle) of the laser light. When the laser light emitted from the semiconductor laser element enters on the inclined surface S, a portion of the laser light is reflected and the remaining portion is absorbed. However, the configuration described above allows that laser light can be extracted from the transmissive member 20 without the laser light entering directly on the inclined surface S, and opportunities of absorption of the laser light can be reduced. As a result, light extraction efficiency can be improved.

As the transmissive member 20, a member which does not contain phosphor and which is at least transmissive with respect to light emitted by the light-emitting element 10 may be used. It is preferable that the transmissive member 20 is a member with a higher conductivity than the phosphor in the phosphor-containing members 30. Alternatively, when the phosphor-containing members 30 contain a transmissive base material, binder particles and the like, it is preferable that the transmissive member 20 is a member with a higher conductivity than not only the phosphor but also at least one of the transmissive base material and the binder particles. Further, it is more preferable that the transmissive member 20 is a member with a higher conductivity than not only the phosphor but also both of the transmissive base material and the binder particles. Examples of such a member includes sapphire ($Al_2O_3$), magnesia (MgO), or the like.

Phosphor-containing Member 30

The phosphor-containing members 30 are provided in the plurality of recessed portions X and are not provided on the upper surface of the transmissive member 20 between the plurality of recessed portions X. Accordingly, a portion of light can enter and pass through the transmissive member 20 between the phosphor-containing members 30 and exit the transmissive member 20 without passing through the phosphor-containing members 30. The phosphor-containing members 30 are preferably in contact with inner surfaces of the plurality of recessed portions X. This allows for heat generated at the phosphor-containing members 30 to be radiated more efficiently. The phosphor-containing members 30 preferably fill the recessed portions X from a lower end to an upper end thereof This allows for the contact area between the phosphor-containing members 30 and the transmissive member 20 to be increased as compared to a case where the phosphor-containing members 30 only fill a portion of the recessed portions X. Thus, heat radiation from the phosphor-containing members 30 can be performed more effectively.

A transmissive member containing a phosphor can be used as the phosphor-containing members 30. The phosphor-containing members 30 may be members in which phosphor is dispersed among a base material (for example, glass or sapphire). The base material is transmissive with respect to light from the light-emitting element 10 and the phosphor. The phosphor-containing members 30 may also be a sintered body in which particles of the phosphor are bound to each other by minute binder particles or the like. As the phosphor, a phosphor that converts a wavelength of light emitted by the light-emitting element 10 can be used. A yellow phosphor such as YAG or a red phosphor such as CASN can be used. Two or more types of phosphors can be mixed in the phosphor-containing members 30.

The phosphor-containing members 30 can be fabricated using, for example, any of methods (1) to (4) described below.

(1) After applying phosphor to the plurality of recessed portions X in the transmissive member 20 or after filling the plurality of recessed portions X in the transmissive member 20 with a phosphor powder, the transmissive member 20 is sintered. For example, cold isostatic pressing (CIP) or hot isostatic pressing (HIP) may be used for the sintering. Spark plasma sintering (SPS), pressureless sintering, reaction sintering, hot pressing, or the like, may also be used for the sintering.

(2) After mixing phosphor into an inorganic material, the mixture is printed onto the transmissive member 20 having the plurality of recessed portions X.

(3) A mixed powder of phosphor and an inorganic material is applied onto the transmissive member 20 and excess phosphor is removed by grinding and/or polishing.

(4) Phosphor is mixed into a resin, the plurality of recessed portions X are filled by the mixture, and the resin is hardened.

When a semiconductor laser element constituted by a nitride semiconductor is used as the light-emitting element 10, it is preferable that resin is not used in the phosphor-containing members 30. This is because discoloration of the resin may occur due to the resin being burned by the laser light.

Light-diffusing Member 80

A light-diffusing member 80 is preferably provided on a light-exiting side (upper side) of the transmissive member 20 so that color variation can be reduced. In this case, the light-diffusing member 80 is preferably in contact with a light-exiting surface of the transmissive member 20. This allows for heat generated at the phosphor-containing members 30 to be also radiated from the light-diffusing member 80, and a decline in light emission efficiency of the phosphor can be prevented even more effectively. A thickness of the light-diffusing member 80 is preferably thick enough to cause a reduction in color variation and can be set, for example, greater than a thickness of the phosphor-containing members 30. As the light-diffusing member 80, a member including a base material and diffusion particles of $TiO_2$, or the like, whose refractive index differs from that of the base material can be used. As the base material, a resin, or the like, that is transmissive with respect to light from the light-emitting element 10 and the phosphor-containing members 30 can be used. The diffusion particles are dispersed in the base material. As the light-diffusing member 80, a sintered body of a transmissive oxide, such as silica ($SiO_2$), or materials with superior thermal conductivity, such as alumina ($Al_2O_3$) and magnesia (MgO), can also be used.

Filter 90

Preferably, a filter 90 which transmits light emitted from the light-emitting element 10, but reflects light emitted from the phosphor-containing members 30, is provided on a light-entering side (lower surface) of the transmissive member 20. The filter 90 can reflect light directed from the phosphor-containing members 30 toward the light-emitting element 10 (returning light) in a direction toward the upper surface of the transmissive member 20. Therefore, light can be extracted more efficiently from the light-emitting device. As the filter 90, a bandpass filter having higher reflectance with respect to wavelength-converted light from the phosphor than reflectance with respect to an emission wavelength of the light-emitting element 10 can be used. For example, a bandpass filter whose reflectance with respect to wavelength-converted light from the phosphor is 80% or higher and whose reflectance with respect to an emission wavelength of the light-emitting element 10 is 10% or lower can be used as the filter 90. As the filter 90, for example, a dielectric multilayer film in which a plurality of dielectric films made of $SiO_2$ or $TiO_2$ are stacked may be used. Reflectance with respect to wavelength-converted light from the phosphor and reflectance with respect to an emission wavelength of the light-emitting element 10 can be controlled by materials and film thicknesses of the dielectric films.

The filter 90 is provided between the phosphor-containing members 30 and the light-emitting element 10 so as to reduce returning light to the light-emitting element 10. In a case where the filter 90 is provided directly on the phosphor-containing members 30, desired reflectance is less likely to be obtained and light emission efficiency may decline. In addition, in this case, heat cannot be sufficiently radiated from the phosphor-containing members 30 if the filter 90 is made of a dielectric material. However, with the light-emitting device according to the present embodiment, because the filter 90 can be provided on the transmissive member 20 instead of directly on the phosphor-containing members 30, such a problem does not occur.

Other Elements

The light-emitting element 10 is placed on a submount 50. Submount 50 is provided on a pedestal 40. Power is supplied to the light-emitting element 10 from an electrode 60 via a wire or the like. The light-emitting element 10 is covered by the cap 70. Cap 70 includes the window portion 70a. Light emitted from the light-emitting element 10 passes through the window portion 70a of the cap 70 to be extracted to the outside of the cap 70. As the pedestal 40 and the submount 50, preferably, copper, brass, tungsten, aluminum, a copper-tungsten alloy, or the like, is used. As the cap 70, metal (stainless steel, copper, brass, kovar, aluminum, silver, or the like), alumina ($Al_2O_3$), silicon carbide (SiC), CuW, Cu-diamond, diamond, or the like, may be used. The pedestal 40 and the cap 70 may be formed in a cylindrical shape, a disk shape, or the like. However, the shapes of the pedestal 40 and the cap 70 are not particularly limited so long as the light-emitting element 10 can be protected.

With the light-emitting device according to the first embodiment described above, because heat generated at the phosphor can be radiated both from below and from the side of the phosphor-containing members 30, a decline in light emission efficiency of the phosphor can be prevented. In addition, because a portion of light may enter and pass through the transmissive member 20 between the phosphor-containing members 30 and exit the transmissive member 20 without passing through the phosphor-containing members 30, loss of light due to the phosphor can be suppressed and a decline in light emission efficiency of the light-emitting device as a whole can be prevented.

Figure 2A:
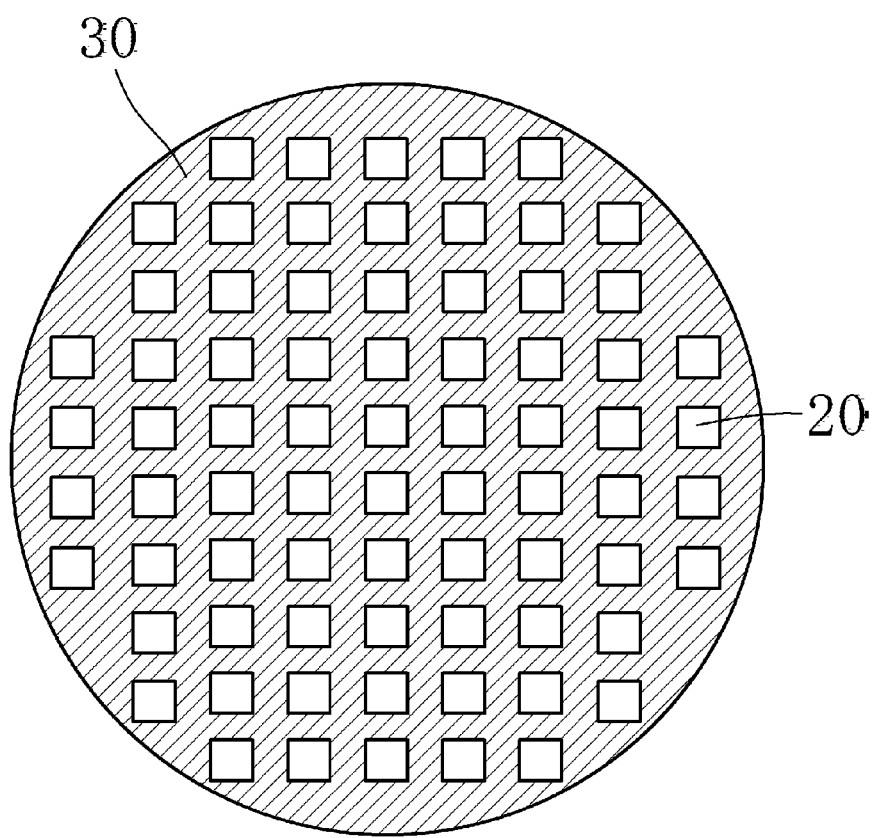
FIG. 2A is a schematic enlarged plan view showing a transmissive member and phosphor-containing members according to a second configuration.
Figure 2B:
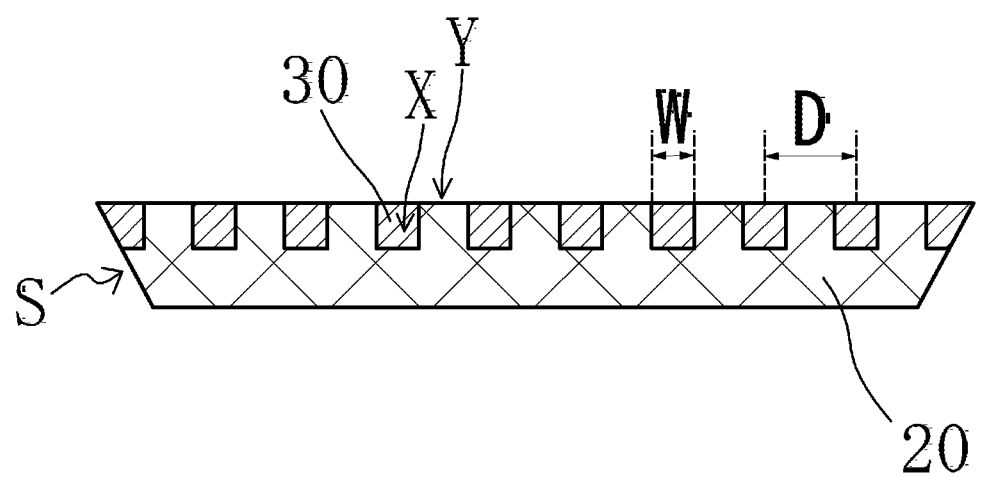
FIG. 2B is a schematic enlarged sectional view showing the transmissive member and the phosphor-containing members according to the second configuration.

Example in which Plurality of Recessed Portions X are Arranged so that a Planer Shape of the Light-emitting Device has a Mesh Pattern FIG. 2A is a schematic enlarged plan view showing a transmissive member and phosphor-containing members according to a second configuration, and FIG. 2B is a schematic enlarged sectional view showing the transmissive member and the phosphor-containing members of the second configuration. As shown in FIGS. 2A and 2B, the plurality of recessed portions X may be arranged in a mesh pattern. Even in this case, a decline in light emission efficiency of the phosphor can be prevented and a decline in light emission efficiency of the light-emitting device as a whole can be prevented in a similar manner to a case where the plurality of recessed portions X are arranged in a dotted pattern. The light-emitting device in which the plurality of recessed portions X are arranged in a mesh pattern, as shown in FIG. 2A and 2B, can be considered, from a different perspective, as a light-emitting device in which a plurality of protruding portions Y are arranged in a dotted pattern. In this case, the phosphor-containing members 30 are provided between the plurality of protruding portions Y. Even from this perspective, a portion of light may enter and pass through the transmissive member 20 between the phosphor-containing members 30 and exit the transmissive member 20 without passing through the phosphor-containing members 30.

Figure 3A:
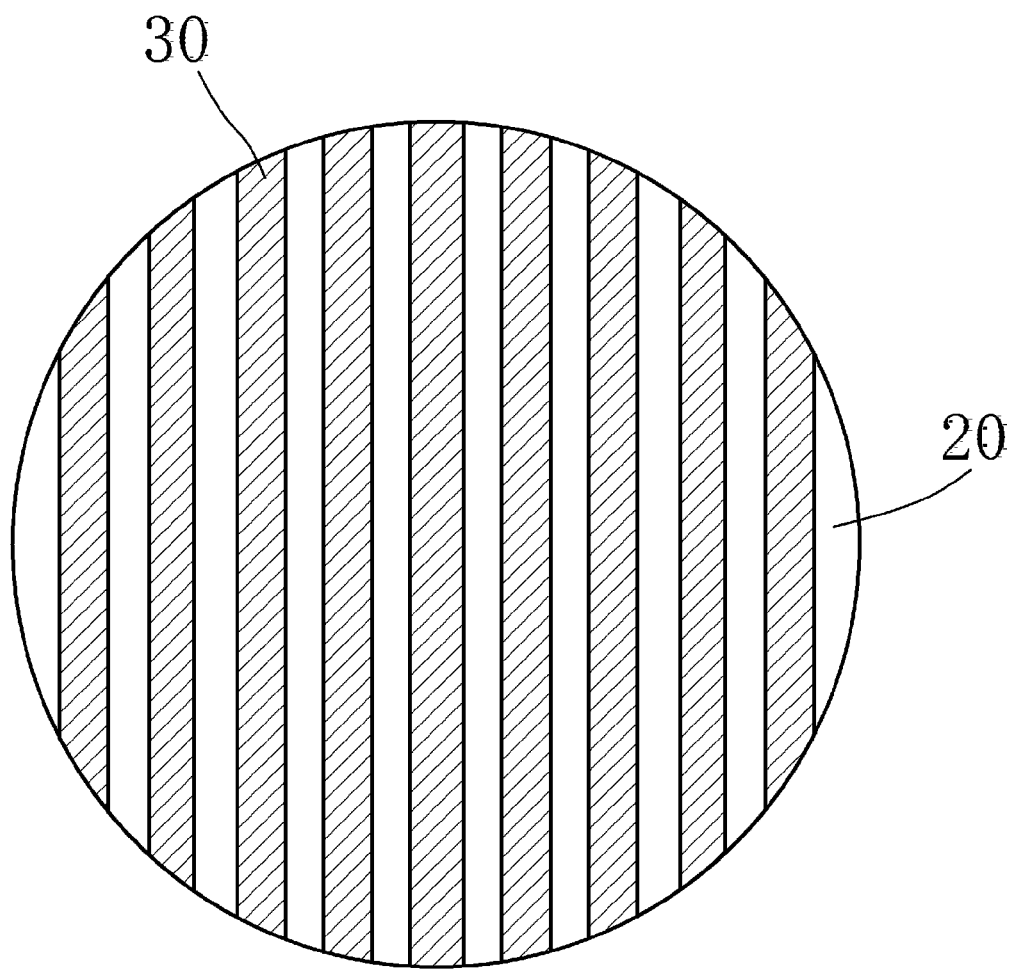
FIG. 3A is a schematic enlarged plan view showing a transmissive member and phosphor-containing members according to a third configuration.
Figure 3B:
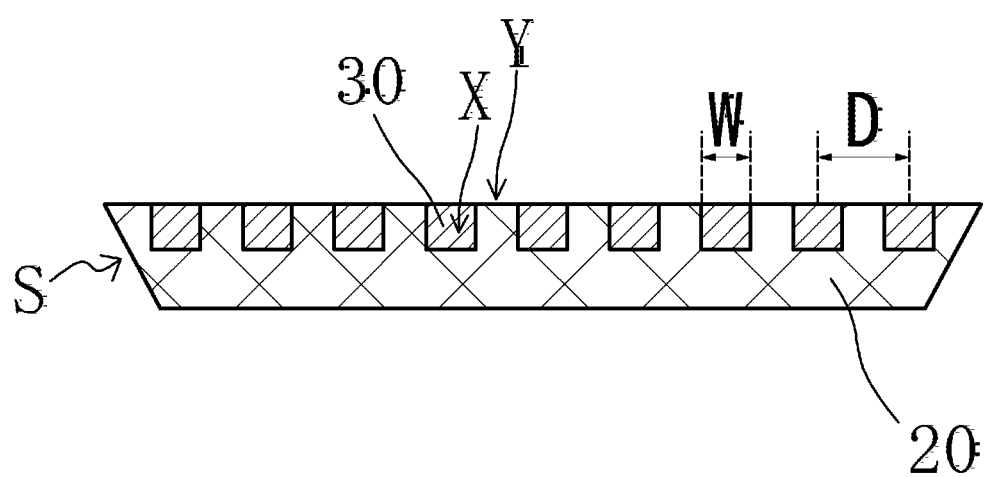
FIG. 3B is a schematic enlarged sectional view showing the transmissive member and the phosphor-containing members according to the third configuration.

Example in which Plurality of Recessed Portions X are Arranged so that a Planer Shape of the Light-Emitting Device has a Striped Pattern FIG. 3A is a schematic enlarged plan view showing a transmissive member and phosphor-containing members according to a third configuration, and FIG. 3B is a schematic enlarged sectional view showing the transmissive member and the phosphor-containing members according to the third configuration. As shown in FIGS. 3A and 3B, the plurality of recessed portions X may be arranged in a striped pattern. Even in this case, a decline in light emission efficiency of the phosphor can be prevented and a decline in light emission efficiency of the light-emitting device as a whole can be prevented in a similar manner to a case where the plurality of recessed portions X are arranged in a dotted pattern. The light-emitting device in which the plurality of recessed portions X are arranged in a striped pattern, as shown in FIGS. 3A and 3B, can be considered, from a different perspective, as a light-emitting device in which a plurality of protruding portions Y are arranged in a striped pattern. In this case, the phosphor-containing members 30 are provided between the plurality of protruding portions Y. Even from this perspective, a portion of light may enter and pass through the transmissive member 20 between the phosphor-containing members 30 and exit the transmissive member 20 without passing through the phosphor-containing members 30. The plurality of recessed portions X or protruding portions Y that are arranged in a striped pattern can be readily formed by providing grid-like grooves on a surface of the transmissive member 20 using a dicer or the like.

Other Examples of Sectional Shapes of the Plurality of Recessed Portions X

Figure 4:
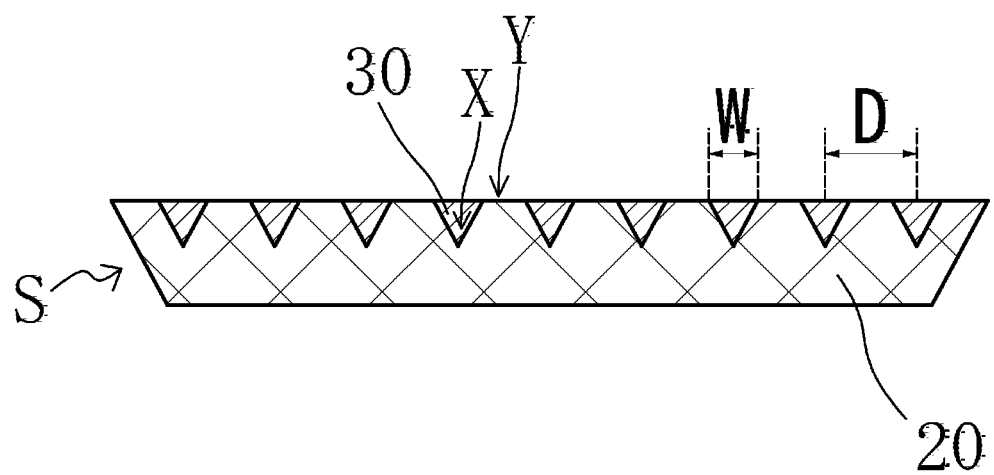
FIG. 4 is a schematic enlarged sectional view showing a transmissive member and phosphor-containing members according to a fourth configuration.
Figure 5:
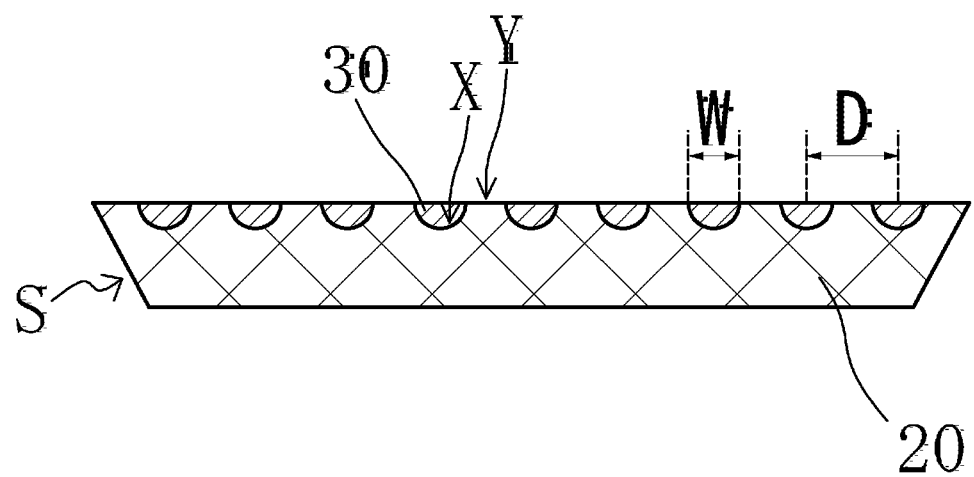
FIG. 5 is a schematic enlarged sectional view showing a transmissive member and phosphor-containing members according to a fifth configuration.
Figure 6:
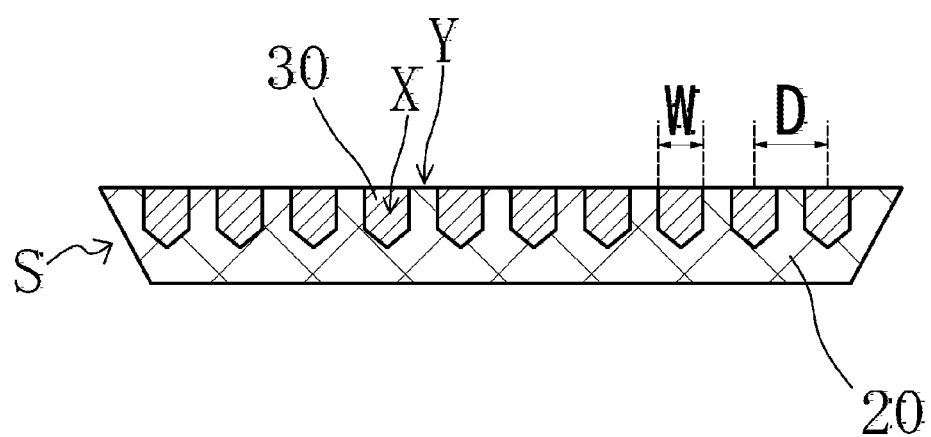
FIG. 6 is a schematic enlarged sectional view showing a transmissive member and phosphor-containing members according to a sixth configuration.
Figure 7:
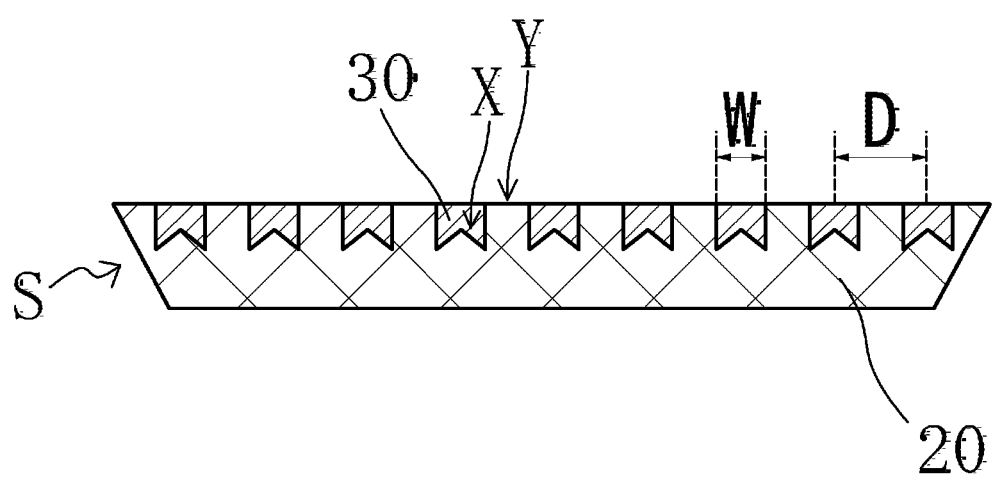
FIG. 7 is a schematic enlarged sectional view showing a transmissive member and phosphor-containing members according to a seventh configuration.

FIGS. 4, 5, 6, and 7 are schematic enlarged sectional views showing transmissive members and phosphor-containing members according to a fourth, fifth, sixth, and seventh configuration, respectively. The sectional shapes of the plurality of recessed portions X may be a rectangular shape as shown in FIGS. 1D, 2B, and 3B, a V-shape (inversed triangular shape) as shown in FIG. 4, a semicircular shape as shown in FIG. 5, a shape in which only a bottom has an inversed triangular shape and both side surfaces are parallel (including approximately parallel) to each other as shown in FIG. 6, or a shape in which only a bottom has a triangular shape and both side surfaces are parallel (including approximately parallel) to each other as shown in FIG. 7. Even with these shapes, a decline in light emission efficiency of the phosphor can be prevented and a decline in light emission efficiency of the light-emitting device as a whole can be prevented in a similar manner to a case where the sectional shape of each of the plurality of recessed portions X is a rectangular shape. As shown in FIGS. 6 and 7, in a case where the sectional shape of the recessed portions X is a shape in which only a bottom has an inversed triangular shape or a triangular shape and both side surfaces are approximately parallel to each other, a surface area of the recessed portions X can be increased as compared to a case where the sectional shape of the recessed portions X is rectangular. Therefore, heat radiation is improved.

As described above, a shape in which a plurality of recessed portions X are formed can be considered, from a different perspective, a shape in which a plurality of protruding portions Y are formed. When such a perspective is adopted, the description provided above can be understood by replacing a "sectional shape of each of the plurality of recessed portions X" with a "sectional shape between the plurality of protruding portions Y". In other words, the sectional shapes between the plurality of protruding portions Y may be, for example, a rectangular shape as shown in FIGS. 1D, 2B, and 3B, a V-shape (inversed triangular shape) as shown in FIG. 4, a semicircular shape as shown in FIG. 5, a shape in which only a bottom has an inversed triangular shape and both side surfaces are parallel (including approximately parallel) to each other as shown in FIG. 6, or a shape in which only a bottom has a triangular shape and both side surfaces are parallel (including approximately parallel) to each other as shown in FIG. 7.

Light-emitting Device According to Second Embodiment

Figure 8A:
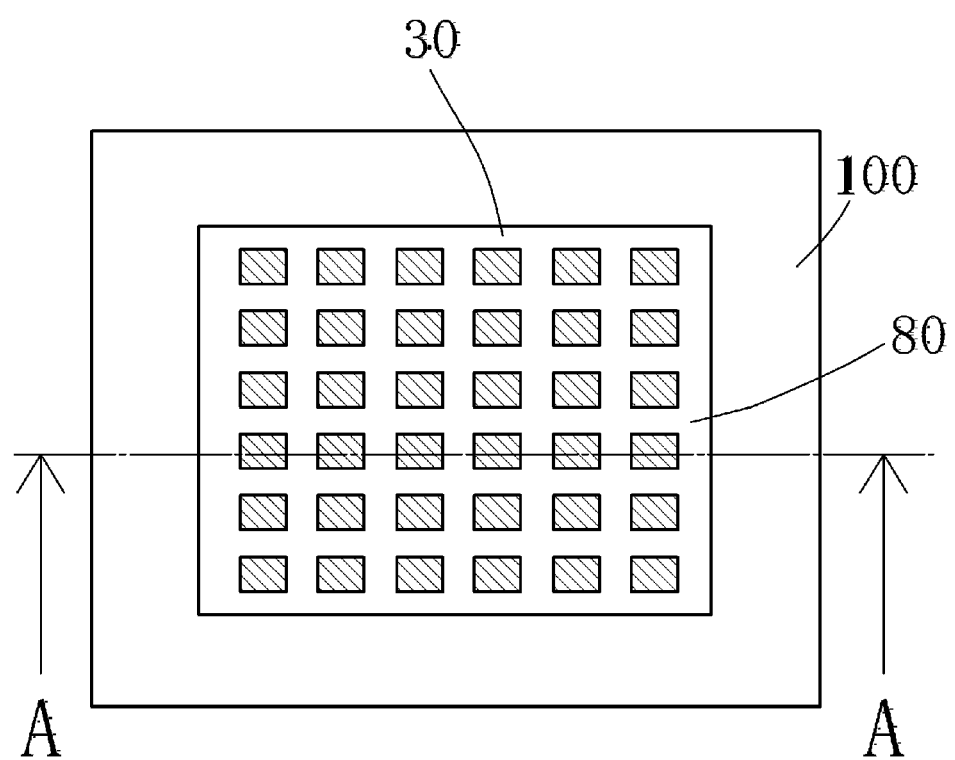
FIG. 8A is a schematic plan view of a light-emitting device according to a second embodiment.
Figure 8B:
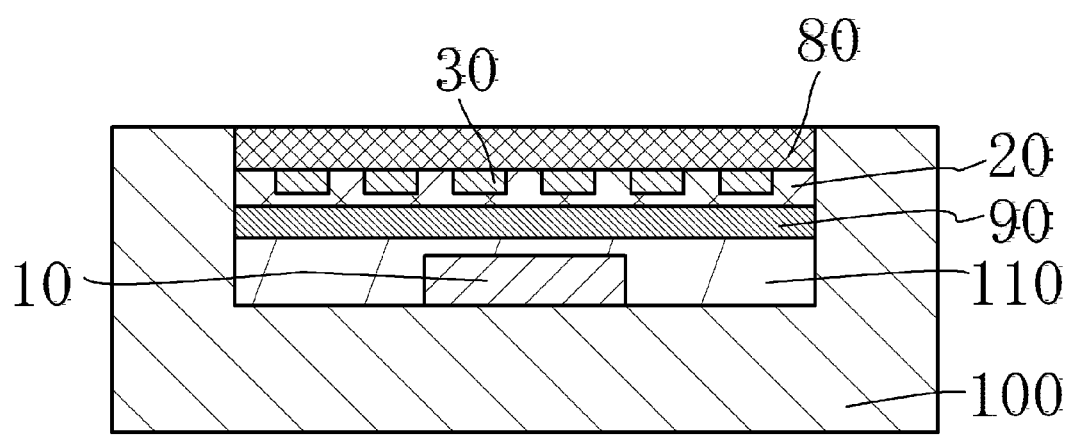
FIG. 8B is a schematic sectional view of the light-emitting device according to the second embodiment.

FIG. 8A is a schematic plan view of a light-emitting device according to a second embodiment, and FIG. 8B is a schematic sectional view of the light-emitting device according to the second embodiment. As shown in FIGS. 8A and 8B, in the light-emitting device according to the second embodiment, the light-emitting device 10 is housed in a package 100 and sealed by a sealing resin 110. In the second embodiment, the transmissive member 20 described above is provided on an upper surface of the sealing resin 110. Configurations of the transmissive member 20 and the phosphor-containing members 30 are similar to those in the first embodiment. Even with the light-emitting device according to the second embodiment, a decline in light emission efficiency of phosphor can be prevented and a decline in light emission efficiency of the light-emitting device as a whole can be prevented in a similar manner to the light-emitting device according to the first embodiment. A resin package, a ceramic package, or the like, can be used as the package 100. A transmissive resin such as silicon resin can be used as the sealing resin 110.

While embodiments have been described above, it is to be understood that the description is merely exemplary and does not limit the invention as set forth in the appended claims in any way whatsoever.

What is claimed is:

1. A laser diode device comprising:
   a semiconductor laser element;
   a cap covering the semiconductor laser element and comprising:
      a side wall extending vertically and surrounding the semiconductor laser element,
      a top wall extending laterally inward from a top of the side wall, and
      a window portion extending through the top wall;
   a transmissive member disposed in the window portion and separately from the semiconductor laser element, the transmissive member comprising a plurality of recessed portions on a side opposite to a side in which light emitted from the semiconductor laser element enters and within a region that is irradiated with the light emitted from the semiconductor laser element, wherein at least two of said recessed portions are located directly above the semiconductor laser element; and
   phosphor-containing members provided in the plurality of recessed portions,
   wherein a portion of the light emitted from the semiconductor laser element enters and passes through the transmissive member between the phosphor-containing members and exits the transmissive member without passing through the phosphor-containing members.

2. The laser diode device according to claim 1, wherein a width of each recess portion is in a range of 10 to 100 µm.

3. The laser diode device according to claim 1, wherein the transmissive member has a lowermost surface in which light emitting from the semiconductor laser element enters, and an uppermost surface opposite the lowermost surface, and
   wherein the recessed portions are recessed into the uppermost surface of the transmissive member.

4. A laser diode device comprising:
   a single semiconductor laser element;
   a cap covering the semiconductor laser element and comprising:
      a side wall extending vertically and surrounding the single semiconductor laser element,
      a top wall extending laterally inward from a top of the side wall, and
      a window portion extending through the top wall;
   a transmissive member disposed in the window portion and separately from the single semiconductor laser element and comprising a plurality of recessed portions disposed on a side opposite to a side in which light emitted from the single semiconductor laser element enters and within a region that is irradiated with the light emitted from the single semiconductor laser element; and
   phosphor-containing members disposed in the plurality of recessed portions,
   wherein a portion of the light emitted from the single semiconductor laser element enters and passes through the transmissive member between the phosphor-containing members and exits the transmissive member without passing through the phosphor-containing members.

5. The laser diode device according to claim 4, wherein the transmissive member comprises an inclined surface with an inverted tapered shape on a portion of a side surface of the transmissive member in the vicinity of a lower surface of the transmissive member in which the light emitted from the semiconductor laser element enters.

6. The laser diode device according to claim 1, wherein the top wall has a planar upper surface and a planar lower surface.

7. The laser diode device according to claim 6,
   wherein the transmissive member has a planar upper surface and a planar lower surface,
   wherein the upper surface of the transmissive member is coplanar with the upper surface of the top wall, and
   wherein the lower surface of the transmissive member is coplanar with the lower surface of the top wall.

8. The laser diode device according to claim 1, wherein the cap is made of metal, alumina, silicon carbide, CuW, Cu-diamond or diamond.

9. The laser diode device according to claim 1,
   wherein a sectional shape of each of the plurality of recessed portions is a V-shape.

10. The laser diode device according to claim 1,
    wherein a sectional shape of each of the plurality of recessed portions is a rectangular shape.

11. The laser diode device according to claim 1,
    wherein a sectional shape of each of the plurality of recessed portions is a semicircular shape.

12. The laser diode device according to claim 1,
wherein the plurality of recessed portions are arranged in a striped pattern or a dotted pattern.

13. The laser diode device according to claim 1, wherein a filter is provided on a light-entering side of the transmissive member, and
the filter transmits the light emitted from the semiconductor laser element and reflects light emitted from the phosphor-containing members.

14. The laser diode device according to claim 4, wherein the top wall has a planar upper surface and a planar lower surface.

15. The laser diode device according to claim 14,
wherein the transmissive member has a planar upper surface and a planar lower surface,
wherein the upper surface of the transmissive member is coplanar with the upper surface of the top wall, and
wherein the lower surface of the transmissive member is coplanar with the lower surface of the top wall.

16. The laser diode device according to claim 4, wherein the cap is made of metal, alumina, silicon carbide, CuW, Cu-diamond or diamond.

17. The laser diode device according to claim 4,
wherein a sectional shape of each of the plurality of recessed portions is a V-shape.

18. The laser diode device according to claim 4,
wherein a sectional shape of each of the plurality of recessed portions is a rectangular shape.

19. The laser diode device according to claim 4,
wherein a sectional shape of each of the plurality of recessed portions is a semicircular shape.

20. The laser diode device according to claim 4,
wherein the plurality of recessed portions are arranged in a striped pattern or a dotted pattern.

21. The laser diode device according to claim 4, wherein a filter is provided on a light-entering side of the transmissive member, and
the filter transmits the light emitted from the semiconductor laser element and reflects light emitted from the phosphor-containing members.

22. The laser diode device according to claim 4,
wherein a width of each recess portion is in a range of 10 to 100 µm.

* * * * *